(12) United States Patent
Hsu et al.

(10) Patent No.: US 11,705,392 B2
(45) Date of Patent: Jul. 18, 2023

(54) ELECTRONIC DEVICE HAVING INTEGRATED CIRCUIT CHIP CONNECTED TO PADS ON SUBSTRATE

(71) Applicant: InnoLux Corporation, Miao-Li County (TW)

(72) Inventors: Mei-Chi Hsu, Miao-Li County (TW); Yu-Chin Lin, Miao-Li County (TW); Yu-Ting Liu, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 17/691,135

(22) Filed: Mar. 10, 2022

(65) Prior Publication Data
US 2022/0199514 A1 Jun. 23, 2022

Related U.S. Application Data

(63) Continuation of application No. 16/871,052, filed on May 11, 2020, now Pat. No. 11,302,622.

(30) Foreign Application Priority Data

Jun. 11, 2019 (CN) .......................... 201910502561.4

(51) Int. Cl.
*H01L 23/498* (2006.01)
*H01L 23/00* (2006.01)

(52) U.S. Cl.
CPC ........ *H01L 23/49838* (2013.01); *H01L 24/16* (2013.01); *H01L 2224/16227* (2013.01)

(58) Field of Classification Search
CPC .......................... H01L 23/49838; H01L 24/16
See application file for complete search history.

(56) References Cited

U.S. PATENT DOCUMENTS

| 8,536,458 B1 * | 9/2013 | Darveaux ............... H01L 24/16 174/255 |
| 2006/0214292 A1 * | 9/2006 | Agraharam ............. H01L 24/13 257/737 |
| 2012/0018904 A1 * | 1/2012 | Lin .......................... H01L 24/06 257/782 |
| 2017/0358546 A1 * | 12/2017 | Shim ....................... H01L 24/10 |
| 2018/0061805 A1 * | 3/2018 | Fang .................... H01L 21/4853 |

FOREIGN PATENT DOCUMENTS

CN 202319296 U 7/2012

* cited by examiner

*Primary Examiner* — Michael Jung
(74) *Attorney, Agent, or Firm* — Winston Hsu

(57) ABSTRACT

The present disclosure provides an electronic device including a substrate, a conductive pad, a chip and an insulating layer. The conductive pad is disposed on the substrate. The chip is disposed on the conductive pad. The insulating layer is disposed between the conductive pad and the chip, wherein the insulating layer includes an opening, and the chip is electrically connected to the conductive pad through the opening. An outline of the opening includes a plurality of curved corners in a normal direction of the substrate.

8 Claims, 11 Drawing Sheets

ELECTRONIC DEVICE HAVING INTEGRATED CIRCUIT CHIP CONNECTED TO PADS ON SUBSTRATE

CROSS REFERENCE TO RELATED APPLICATIONS

This application is a continuation application of U.S. application Ser. No. 16/871,052, filed on May 11, 2020. The content of the application is incorporated herein by reference.

BACKGROUND OF THE DISCLOSURE

1. Field of the Disclosure

The present disclosure relates to an electronic device; more particularly, an electronic device having a conductive pad.

2. Description of the Prior Art

Electronic devices are widely used in daily life, and display panels of the electronic devices may be driven by integrated circuit chips. Therefore, how to improve a quality of electrical connections between the integrated circuit chips and the display panel has become one of many important topic of discussion.

SUMMARY OF THE DISCLOSURE

An embodiment of the present disclosure provides an electronic device including a substrate, a conductive pad, a chip and an insulating layer. The conductive pad is disposed on the substrate. The chip is disposed on the conductive pad. The insulating layer is disposed between the conductive pad and the chip, wherein the insulating layer includes an opening, and the chip is electrically connected to the conductive pad through the opening. An outline of the opening includes a plurality of curved corners in a normal direction of the substrate.

An embodiment of the present disclosure provides an electronic device including a substrate, a first pad, a second pad and an integrated circuit chip. The first pad is disposed on the substrate. The second pad is disposed on the first pad and electrically connected to the first pad. The integrated circuit chip is disposed on the second pad and electrically connected to the second pad. The second pad has a plurality of curved corners.

These and other objectives of the present disclosure will no doubt become obvious to those of ordinary skill in the art after reading the following detailed description of the embodiment that is illustrated in the various figures and drawings.

DETAILED DESCRIPTION

Figure 1:
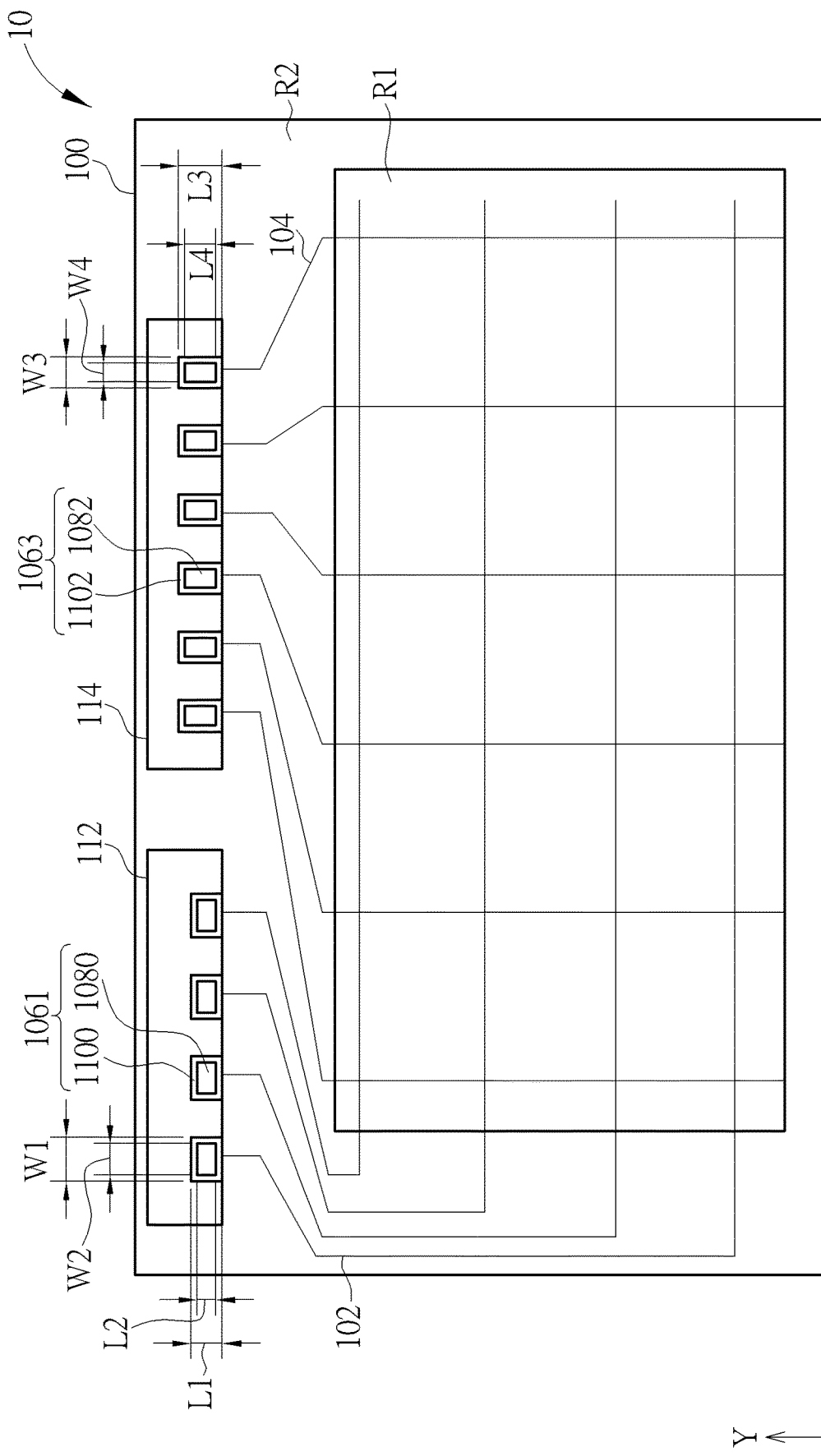
FIG. 1 is a top view of an electronic device according to a first embodiment of the present disclosure.

The present disclosure may be understood by reference to the following detailed description, taken in conjunction with the embodiments and drawings as described below. It is noted that, for purposes of illustrative clarity and being easily understood by the readers, various drawings of this disclosure may be simplified schematic diagrams that partially illustrate an electronic device or a tiled device; certain components within may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not in function. In the following description and in the claims, the terms "include", "comprise" and "have" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

The term "about", "substantially", "equal", or "same" generally refers to falling within 20% of a given value or range, or to falling within 10%, 5%, 3%, 2%, 1%, or 0.5% of a given value or range.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following description may be replaced, recombined, or mixed with one another to constitute another embodiment without departing from the spirit of the present disclosure.

An electronic device according to the present disclosure may include a displace device, an antenna device, a sensing device, a light-emitting device or a tiled device, but not limited thereto. The electronic device may include foldable or flexible electronic devices. The electronic device may include a liquid crystal layer or a light-emitting diode. A light-emitting diode may include organic light-emitting diodes (OLEDs), mini light-emitting diodes (mini LEDs), micro light-emitting diodes (micro LEDs) or quantum dot light-emitting diodes (quantum dot LEDs, QLEDs, QDLEDs), fluorescent materials, phosphorescent materials, other suitable materials or a combination of the above materials and devices, but not limited thereto. In the description below, a display device is illustrative of an example of an electronic device of the present disclosure, but the present disclosure is not limited thereto.

Please refer to FIG. 1, which shows a top view of an electronic device according to a first embodiment of the present disclosure. An electronic device 10 may include a substrate 100, a plurality of conductive lines (conductive line 102 and/or conductive line 104), a plurality of bonding pads (bonding pad 1061 and/or bonding pad 1063) and at least one integrated circuit chip (integrated circuit chip 112 and/or integrated circuit chip 114), but not limited thereto. The substrate 100 may include an operating region R1 and a peripheral region R2, and the peripheral region R2 is disposed on at least one side adjacent to the operating region R1. As shown in FIG. 1, the peripheral region R2 may surround the operating region R1. The operating region R1 may include a display area, a detecting area, a sensing area or a light-emitting area, but not limited thereto.

In some embodiments, the substrate 100 may include a rigid substrate, a flexible substrate (such as a foldable or deformable substrate) or a combination of the above, but not limited thereto. In some embodiments, the substrate 100 may include plastic, glass, quartz, organic polymer, metal, ceramic materials, or a combination of the aforementioned materials, but not limited thereto. If the substrate 100 include organic polymers, for example polyimide (PI), polyethylene terephthalate (PET), polycarbonate (PC) or a combination of the aforementioned materials, but not limited thereto.

As shown in FIG. 1, a plurality of conductive lines (conductive line 102 and/or conductive line 104) may be disposed on the substrate 100, and the plurality of conductive lines correspondingly disposed on the operating region R1 and the peripheral region R2. As shown in FIG. 1, the bonding pad (bonding pad 1061 and/or bonding pad 1063) may be disposed on the substrate 100, and the bonding pad correspondingly disposed on the peripheral region R2; the bonding pad (bonding pad 1061 and/or bonding pad 1063) may be electrically connected to a conductive line (conductive line 102 and/or conductive line 104). In some embodiments, the conductive line may include a scan line, a data line, a read line or other suitable lines, but not limited thereto. For example, the bonding pad 106 is 1 electrically connected to the conductive line 102 (such as the scan line), or the bonding pad 1063 is electrically connected to the conductive line 104 (such as the data line or the read line).

In some embodiments, the bonding pad of the electronic device 10 may include a first pad and a second pad. The first pad may be disposed on the substrate 100, and the second pad may be disposed on and electrically connected to the first pad. The integrated circuit chip may be disposed on and electrically connected to the second pad. For example, as shown in FIG. 1, the bonding pad 1061 may include a first pad 1080 and a second pad 1100, the bonding pad 1063 may include a first pad 1082 and a second pad 1102. As an example, the conductive line 102 is connected to the first pad 1080 of the bonding pad 1061, and the conductive line 104 is electrically connected to the first pad 1082 of the bonding pad 1063, but not limited thereto.

In some embodiments, the bonding pad 1061 may be a conductive pad that is electrically connected to the scan line (such as conductive line 102), and the bonding pad 1063 may be a conductive pad that is electrically connected to the data line or the read line (such as conductive line 104). Furthermore, dimensions of the bonding pad 1061 and the bonding pad 1063 (such as a length of a side of the bonding pad and/or a width of the bonding pad) may be different. For example, a length of a side of the bonding pad 1061 may be different from a length of a side of the bonding pad 1063. Alternatively, a width of the bonding pad 1061 and a width of the bonding pad 1063 may be different. For example, as shown in FIG. 1, a length of a side of the first pad 1080 of the bonding pad 1061 in a Y direction is less than a length of a side of the first pad 1082 of the bonding pad 1063 in the Y direction, but not limited thereto. In some embodiments, as shown in FIG. 1, a length of a side of the second pad 1100 of the bonding pad 1061 in the Y direction is less than a length of a side of the second pad 1102 of the bonding pad 1063 in the Y direction, but not limited thereto. Furthermore, as an example shown in FIG. 1, a width of the first pad 1080 of the bonding pad 1061 in an X direction is greater than a width of the first pad 1082 of the bonding pad 1063 in the X direction, but not limited thereto. In some embodiments, as shown in FIG. 1, a width of the second pad 1100 of the bonding pad 1061 in the X direction is greater than a width of the second pad 1102 of the bonding pad 1063 in the X direction, but not limited thereto.

In some embodiments, a length L2 of a side of the first pad 1080 may be less than a length L4 of a side of the first pad 1082, wherein the first pad 1080 may be connected to the scan line, and the first pad 1082 may be connected to the data line or the read line, but not limited thereto.

In some embodiments, the length L2 of a side of the first pad 1080 may be in a range from 80 micrometers (μm) to 140 μm (80 μm≤length L2≤140 μm), but not limited thereto. In some embodiments, the length L2 of a side of the first pad 1080 may be in a range from 90 μm to 130 μm (90 μm≤length L2≤130 μm).

In some embodiments, the length L4 of a side of the first pad 1082 may be in a range from 70 μm to 120 μm (70 μm≤length L4≤120 μm), but not limited thereto. In some embodiments, the length L4 of a side of the first pad 1082 may be in a range from 80 μm to 110 μm (80 μm≤length L4≤110 μm).

In some embodiments, a width W2 of the first pad 1080 may be greater than a width W4 of the first pad 1082, wherein the first pad 1080 may be electrically connected to the scan line, and the first pad 1082 may be electrically connected to the data line or the read line, but not limited thereto.

In some embodiments, the width W2 of first pad 1080 may be in a range from 15 μm to 32 μm (15 μm≤width W2≤32 μm), but not limited thereto. In some embodiments, the width W2 of the first pad 1080 may be in a range from 17 μm to 30 μm (17 μm≤width W2≤30 μm).

In some embodiments, the width W4 of the first pad 1082 may be in a range from 8 μm to 23 μm (8 μm≤width W4≤23 μm), but not limited thereto. In some embodiments, the width W4 of the first pad 1082 may be in a range from 10 μm to 20 μm (10 μm≤width W4≤20 μm).

In some embodiments, a length L1 of a side of the second pad 1100 may be less than a length L3 of a side of the second pad 1102. In some embodiments, the length L1 of a side of the second pad 1100 may be in a range from 70 µm to 120 µm (70 µm≤length L1≤120 µm), but not limited thereto. In some embodiments, the length L1 of a side of the second pad 1100 may be in a range from 80 µm to 110 µm (80 µm≤length L1≤110 µm).

In some embodiments, the length L3 of a side of the second pad 1102 may be in a range from 80 µm to 140 µm (80 µm≤length L3≤140 µm), but not limited thereto. In some embodiments, the length L3 of a side of the second pad 1102 may be in a range from 90 µm to 130 µm (90 µm≤length L3≤130 µm).

In some embodiments, a width W1 of the second pad 1100 may be greater than a width W3 of the second pad 1102. In some embodiments, the width W1 of the second pad 1100 may be in a range from 15 µm to 34 µm (15 µm≤width W1≤34 µm), but not limited thereto. In some embodiments, the width W1 of the second pad 1100 may be in a range from 18 µm to 30 µm (18 µm≤width W1≤30 µm).

In some embodiments, the width W3 of the second pad 1102 may be in a range from 8 µm to 24 µm (8 µm≤width W3≤24 µm), but not limited thereto. In some embodiments, the width W3 of the second pad 1102 may be in a range from 10 µm to 22 µm (10 µm≤width W3≤22 µm).

Definitions and methods of measurement of the aforementioned lengths of sides and widths of the first pad and the second pad shall be discussed in detail in the following figures.

As shown in FIG. 1, in some embodiments, the length L1 of a side of the second pad 1100 may be greater than the length L2 of a side of the first pad 1080, but not limited thereto. In some embodiments, the width W1 of the second pad 1100 may be greater than the width W2 of the first pad 1080, but not limited thereto. In some embodiments, the length L3 of a side of the second pad 1102 may be greater than the length L4 of a side of the first pad 1082, but not limited thereto. In some embodiments, as shown in FIG. 1, the width W3 of the second pad 1102 may be greater than the width W4 of the first pad 1082, but not limited thereto.

As shown in FIG. 1, in some embodiments, the second pad 1100 covers the first pad 1080; that is, a projected area of the first pad 1080 onto the substrate 100 is inside a projected area of the second pad 1100 onto the substrate 100. Similarly, the second pad 1102 covers the first pad 1082; that is, a projected area of the first pad 1082 onto the substrate 100 is inside a projected area of the second pad 1102 onto the substrate 100.

In some embodiments, the first pad 1080 and the first pad 1082 may include a single conductive structure or multiple conductive structures that will be described in detail in the following sections. In some embodiments, the second pad 1100 and the second pad 1102 may include a single conductive structure or multiple conductive structures that will be described in detail in the following sections. In some embodiments, the first pad 1080 and the first pad 1082 include metal, transparent conductive materials or a combination of the aforementioned materials, but not limited thereto. In some embodiments, the second pad 1100 and the second pad 1102 include metals, transparent conductive materials or a combination of the aforementioned materials, but not limited thereto. Such transparent conductive materials include indium tin oxide (ITO), indium zinc oxide (IZO), indium gallium zinc oxide (IGZO), indium tin zinc oxide (ITZO), antimony tin oxide (ATO), antimony zinc oxide (AZO), other suitable transparent conductive materials or a combination of the aforementioned materials, but not limited thereto. Such metals include copper (Cu), aluminum (Al), titanium (Ti), gold (Au), tin (Sn), silver (Ag), molybdenum (Mo), silicon (Si), other suitable metals or a combination of the aforementioned materials, but not limited thereto. In some embodiments, the materials of the second pad (the second pad 1100 and/or the second pad 1102) have better anti-corrosion/anti-erosion properties than the materials of the first pad (the first pad 1080 and/or the first pad 1082). For example, the materials of the second pad (the second pad 1100 and/or the second pad 1102) may include transparent conductive materials, and the materials of the first pad (the first pad 1080 and/or the first pad 1082) may include metals, but not limited thereto.

As mentioned above, when the materials of the second pad (the second pad 1100 and/or the second pad 1102) has better anti-corrosion/anti-erosion properties than the materials of the first pad (the first pad 1080 and/or the first pad 1082), and the second pad (the second pad 1100 and/or the second pad 1102) covers the first pad (the first pad 1080 and/or the first pad 1082), the first pad may be less likely to be corroded/eroded.

In some embodiments, the integrated circuit chip may be disposed on and electrically connected to the second pad. As shown in FIG. 1, the integrated circuit chip 112 may be disposed on and electrically connected to the second pad 1100, and/or the integrated circuit chip 114 may be disposed on and electrically connected to the second pad 1102.

Figure 2:
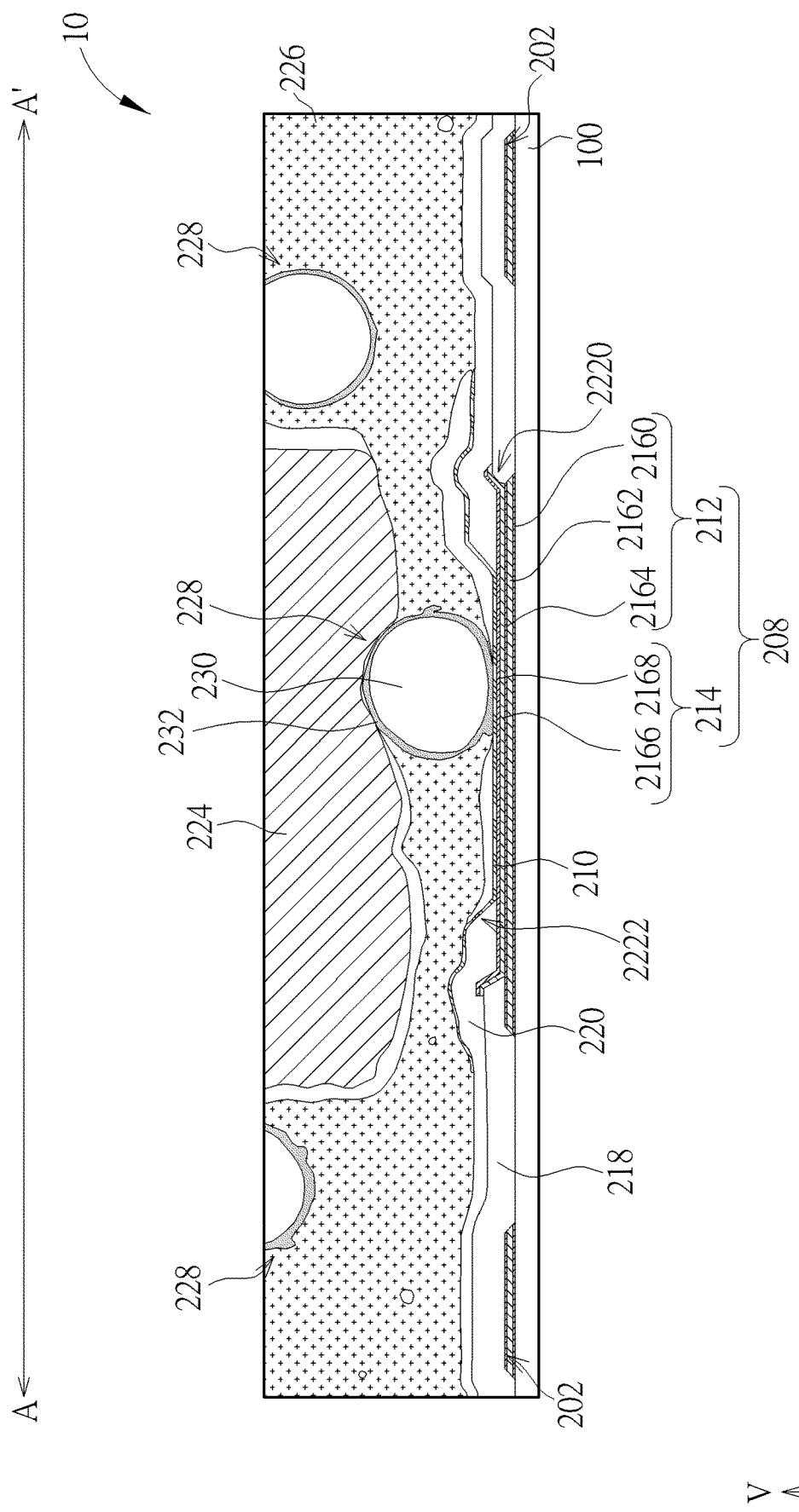
FIG. 2 is a partial schematic diagram of the electronic device according to the first embodiment of the present disclosure.

Please refer to FIG. 2, which shows a partial schematic diagram of the electronic device according to the first embodiment of the present disclosure. The enlarged electronic device of FIG. 2 may be observed through a scanning electron microscope (SEM), but it is not limited. As shown in FIG. 2, the first pad 208 may be disposed on the substrate 100, and the second pad 210 may be disposed on the first pad 208. The first pad 208 may be the first pad 1080 and/or the first pad 1082 shown in FIG. 1, and the second pad 210 may the second pad 1100 and/or the second pad 1102 shown in FIG. 1.

In some embodiments, as shown in FIG. 2, the integrated circuit chip has a bump 224, and the bump 224 of the integrated circuit chip overlaps with at least part of the second pad 210 in a normal direction V of the substrate 100. In some embodiments, along an X direction, a width of the bump 224 of the integrated circuit chip is greater than or equal to the width of the second pad 210, wherein the X direction is an extension direction of the integrated circuit chip. In some embodiments, as shown in FIG. 2 along the X direction, the width of the bump 224 of the integrated circuit chip is less than or equal to the width of the second pad 210.

In some embodiments, as shown in FIG. 2, the first pad 208 may include at least one conductive structure. For example, the first pad 208 may include a first conductive structure 212 and a second conductive structure 214, wherein the second conductive structure 214 is disposed on and electrically connected to the first conductive structure 212, the first conductive structure 212 is connected to a conductive line 234, but not limited thereto.

In some embodiments, the first conductive structure 212 and/or the second conductive structure 214 may include a single sub-layer or multiple sub-layers stacked. The first conductive structure 212 and/or the second conductive structure 214 may include two, three or more sub-layers stacked above one another. As an example, as shown in FIG. 2, the first conductive structure 212 may include a sub-layer 2160, a sub-layer 2162 and/or a sub-layer 2164 stacked above one another, and the second conductive structure 214 may include a sub-layer 2166 and/or a sub-layer 2168 stacked above each other.

The materials of the aforementioned sub-layers may include copper, aluminum, titanium, gold, tin, silver, molybdenum, silicon, other suitable metals or a combination of the aforementioned materials, but not limited thereto. In some embodiments, the first conductive structure 212 and/or the second conductive structure 214 may include the stacked layers of molybdenum/aluminum/molybdenum or other stacked layers of suitable materials, but not limited thereto.

It should be noted that, different conductive structures may be separated by insulating layers; that is, at least one insulating layer (such as a first insulating layer 218 shown in FIG. 2) is disposed between the first conductive structure 212 and the second conductive structure 214, as will be detailed in subsequent paragraphs regarding FIG. 2.

In addition, the conductive lines 202 may be disposed on the substrate 100. In some embodiments, the materials of the conductive line 202 may be the same as or different from the materials of the first conductive structure 212. In some embodiments, the conductive line 202 and the first conductive structure 212 may be formed during the same production process, but not limited thereto. In some embodiments, the materials of the conductive line 202 may be the same as or different from the materials of the second conductive structure 214. In some embodiments, the conductive line 202 and the second conductive structure 214 may be formed during the same production process, but not limited thereto.

In some embodiments, a first insulating layer 218 and a second insulating layer 220 may be disposed on the substrate 100. In some embodiments, the first insulating layer 218 is disposed between the first conductive structure 212 and the second conductive structure 214, the first insulating layer 218 has at least one opening 2220, and the second conductive structure 218 is electrically connected to the first conductive structure 214 through the at least one opening 2220. The first insulating layer 218 may cover the conductive line 202 and a portion of the first conductive structure 212 of the first pad 208. More specifically, the first insulating layer 218 may have an opening 2220, and the opening 2220 may expose a portion of the first conductive structure 212. In other words, the opening 2220 may overlap with a portion of the first conductive structure 212 along the normal direction V of the substrate 100. In some embodiments, the second conductive structure 214 may contact the first conductive structure 212 through the opening 2220, or the second conductive structure 214 may be electrically connected to the first conductive structure 212 through the opening 2220. In some embodiments, the second insulating layer 220 is disposed on the first insulating layer 218 and a portion of the second conductive structure 214 of the first pad 208, and the second insulating layer 220 may have an opening 2222 that exposes a portion of the second conductive structure 214, and the second pad 210 contacts the first pad 208 through the opening 2222 of the second insulating layer 220. In other words, the opening 2222 may overlap with a portion of the second conductive structure 214 along the normal direction V of the substrate 100. In some embodiments, the second pad 210 may contact the first pad 208 (such as the second conductive structure 214 of the first pad 208) through the opening 2222, or the second pad 210 may be electrically connected to the first pad 208 through the opening 2222.

Figure 3:
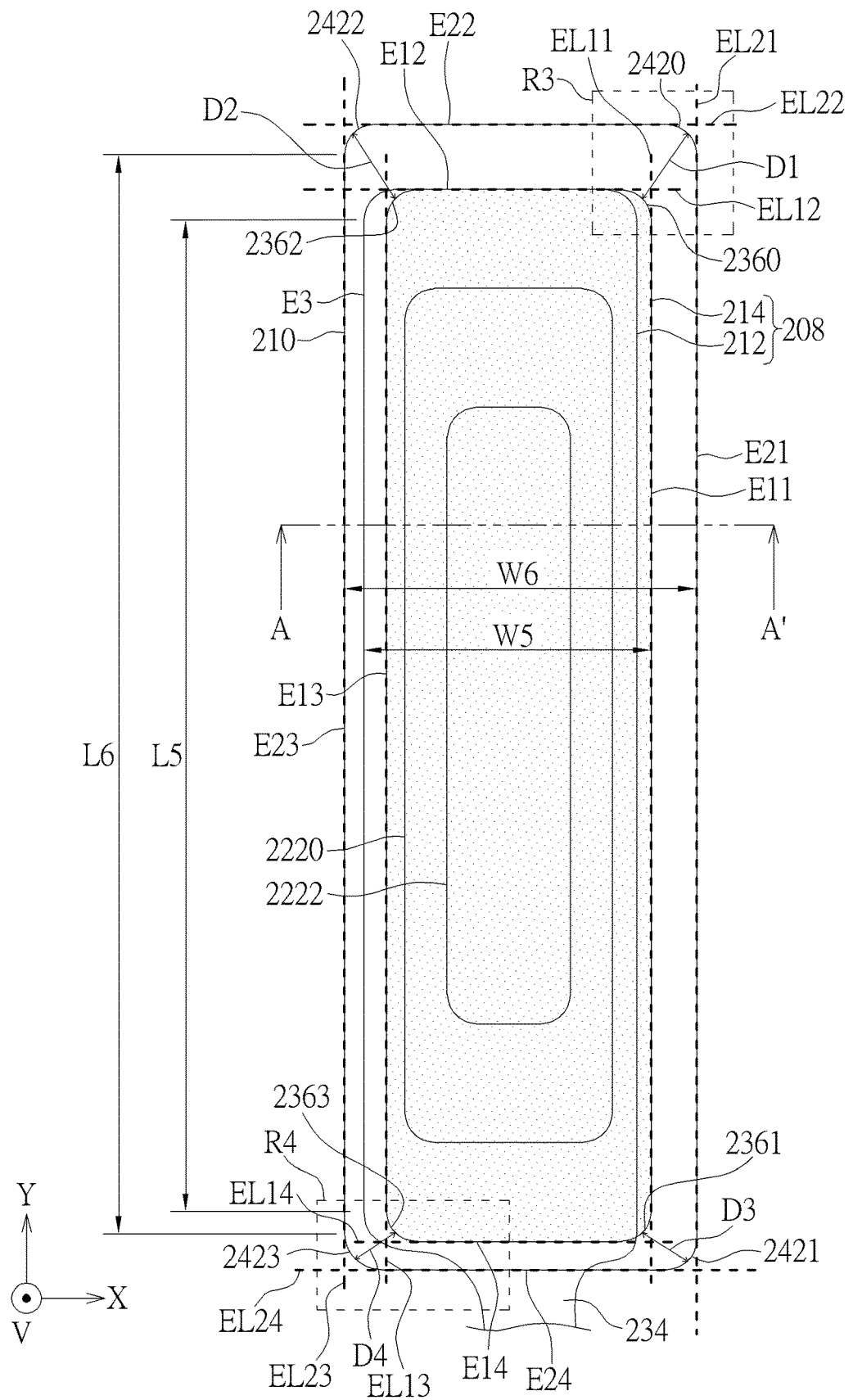
FIG. 3 is a partial top view of the electronic device according to the first embodiment of the present disclosure.

In some embodiments (as shown in FIGS. 2 and 3), the opening 2222 of the second insulating layer 220 and the opening 2220 of the first insulating layer 218 overlap each other along the normal direction V of the substrate 100. In some embodiments (as shown in FIGS. 2 and 3), a projected area of the opening 2220 of the first insulating layer 218 onto the substrate 100 is greater than a projected area of the opening 2222 of the second insulating layer 220 onto the substrate 100. In some embodiments (as shown in FIGS. 2 and 3), the projected area of the opening 2222 onto the substrate 100 is inside the projected area of the opening 2220 onto the substrate 100.

In some embodiments, along the normal direction V of the substrate 100, an outline of the opening 2222 of the second insulating layer 220 may have a plurality of curved corners that may increase adhesion between the second pad 210 and the first pad 208, but not limited thereto.

As shown in FIG. 2, a bump 224 of the integrated circuit chip 112 may overlap with a second pad 210 on the substrate 100 along the normal direction V of the substrate 100. In some embodiments, an anisotropic conductive film (ACF) may electrically connect the bump 224 and the second pad 210. As shown in FIG. 2, the anisotropic conductive film may include an adhesive layer 226 and a conductive particle 228, but not limited thereto. As shown in FIG. 2, the conductive particle 228 may contact a portion of the bump 224 and a portion of the second pad 210, and the bump 224 may be electrically connected to the second pad 210 through the conductive particle 228. In some embodiments, the integrated circuit chip 112 may be transmitted the signals to the conductive line (such as the conductive line 102 or the conductive line 104 shown in FIG. 1) and/or to other electronic components on the substrate 100 through the bump 224, the conductive particle 228, the second pad 210 and the first pad 208, but not limited thereto.

In some embodiments, the conductive particle 228 may include a core 230 and a shell 232 surrounding the core 230. The core 230 may include resin materials, other suitable materials or a combination of the aforementioned materials, but not limited thereto. The shell 232 may include conductive materials such as metals, transparent conductive materials or a combination of the aforementioned materials, but not limited thereto.

The integrated circuit chip 112 (such as a scan chip) of FIG. 1 may be electrically connected to the conductive line 102 (such as the scan line) through the bonding pad 1061, and the integrated circuit chip 114 (such as a data chip) may be electrically connected to the conductive line 104 (such as the data line or the read line) through the bonding pad 1063. In some embodiments, the integrated circuit chip 112 and the integrated circuit chip 114 may be disposed on a same side of the substrate 100, but not limited thereto. In some embodiments, the integrated circuit chip 112 (such as the scan chip) is disposed close to a corner of the substrate 100, and the integrated circuit chip 114 (such as the data chip) is disposed away from a corner of the substrate 100. In some embodiments, the positions of the integrated circuit chip 112 (such as the scan chip) and the integrated circuit chip 114 (such as the data chip) may be adjusted. In some embodiments, the integrated circuit chip 112 (such as the scan chip) and the integrated circuit chip 114 (such as the data chip) may be disposed on different sides. In some embodiments, the number of scan chips may be the same or different from the number of data chips.

Figure 5:
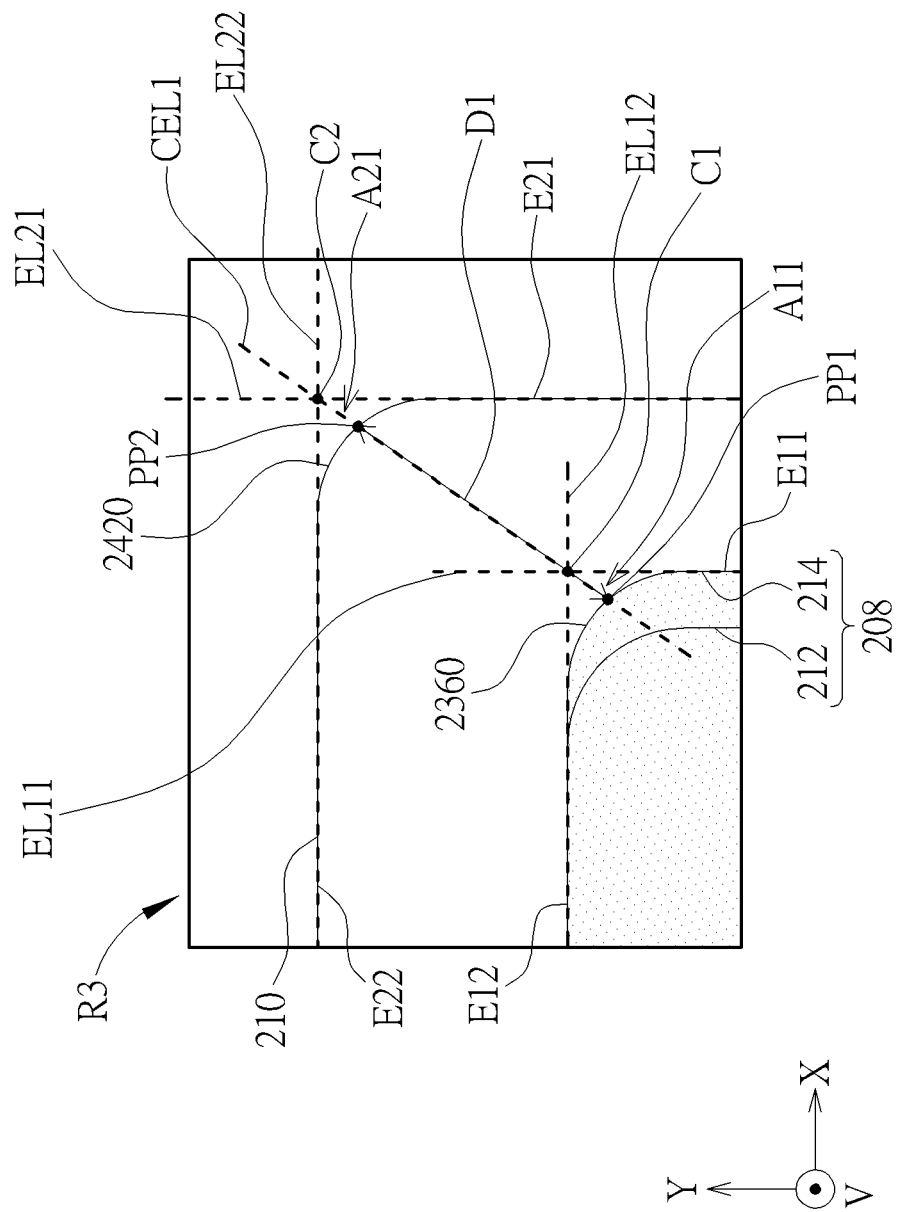
FIG. 5 is a schematic diagram of an enlarged area R3 of FIG. 3.
Figure 6:
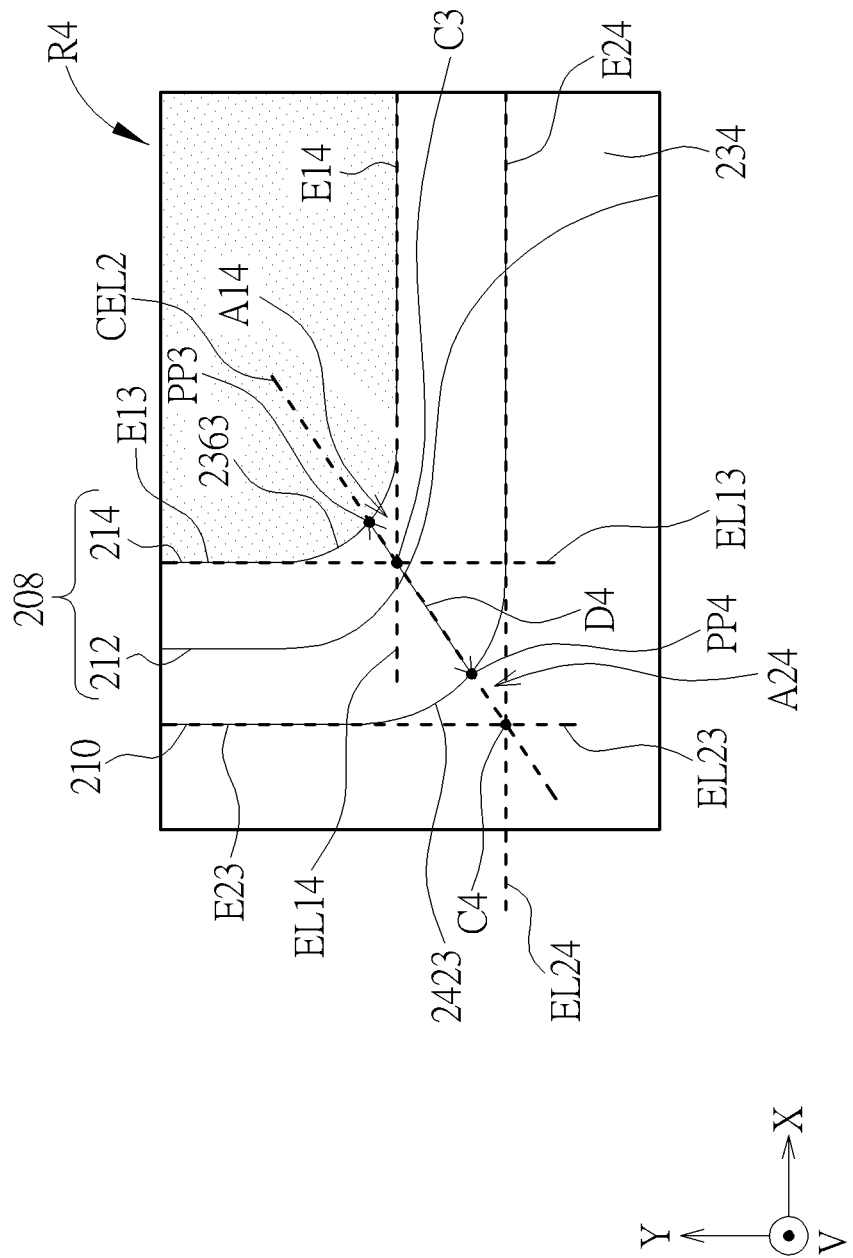
FIG. 6 is a schematic diagram of an enlarged area R4 of FIG. 3.

Please refer to FIGS. 3, 5, and 6. FIG. 3 is a partial top view of the electronic device according to the first embodiment of the present disclosure, wherein a cross-line A-A' shown in FIG. 3 approximately corresponds to the schematic diagram of FIG. 2. FIG. 5 is a schematic diagram of an enlarged area R3 of FIG. 3. FIG. 6 is a schematic diagram of an enlarged area R4 of FIG. 3. As shown in FIG. 3, the second pad 210 may have a plurality of curved corners. The plurality of curved corners of the second pad 210 includes a first curved corner and a second curved corner, wherein the first curved corner is away from a conductive line 234, and the second curved corner is adjacent to the conductive line 234. In other words, one of the plurality of curved corners of the second pad 210 away from the conductive line 234 is defined as the first curved corner, and one of the plurality of curved corners of the second pad 210 adjacent to the conductive line 234 is defined as the second curved corner. As an example, as shown in FIG. 3, a curved corner on an upper right side of the second pad 210 may be a first curved corner 2420, a curved corner on an upper left side of the second pad 210 may be a first curved corner 2422, and the first curved corner 2420 and the first curved corner 2422 are away from the conductive line 234. A curved corner on a lower right side of the second pad 210 may be a second curved corner 2421, a curved corner on a lower left side of the second pad 210 may be a second curved corner 2423, and the second curved corner 2421 and the second curved corner 2423 are adjacent to the conductive line 234.

As shown in FIG. 3, the first pad 208 may have a plurality of curved corners. In some embodiments, the first pad 208 has a plurality of conductive structures (such as the first conductive structure 212 and the second conductive structure 214), the plurality of curved corners of the first pad 208 may refer to the plurality of curved corners of the upper most conductive structure of the first pad 208 (such as the second conductive structure 214). In some embodiments, a conductive structure at a bottom layer of the first pad 208 may also have a plurality of curved corners.

As shown in FIG. 3, in some embodiments, one of the conductive structures of the first pad 208 may be connected to the conductive line 234. As shown in FIG. 3, the first conductive structure 212 of the first pad 208 may be connected to the conductive line 234, but not limited thereto. In other embodiments (not shown), the second conductive structure 214 may be connected to the conductive line 234. In some embodiments, the plurality of curved corners of the first pad 208 (such as the second conductive structure 214) may include a third curved corner and a fourth curved corner; the third curved corner is adjacent to (or corresponds to) the first curved corner of the second pad 210, and the fourth curved corner is adjacent to (or corresponds to) the second curved corner of the second pad 210. In other words, one of the plurality of curved corners of the first pad 208 adjacent to the first curved corner is defined as the third curved corner, and one of the plurality of curved corners of the first pad 208 adjacent to the second curved corner is defined as the fourth curved corner.

As shown in FIG. 3, a curved corner on an upper right side of the second conductive structure 214 may be a third curved corner 2360, a curved corner on an upper left side of the second conductive structure 214 may be a third curved corner 2362, wherein the third curved corner 2360 is adjacent to the first curved corner 2420 and the third curved corner 2362 is adjacent to the first curved corner 2422. A curved corner on a lower right side of the second conductive structure 214 may be a fourth curved corner 2361, a curved corner on a lower left side of the second conductive structure 214 may be a fourth curved corner 2363, wherein the fourth curved corner 2361 is adjacent to the second curved corner 2421, and the fourth curved corner 2363 is adjacent to the second curved corner 2423.

During a manufacturing process, static charges may be generated and/or accumulated on the first pad 208 and/or the second pad 210, the static charges tend to accumulate in an area of the first pad 208 and/or the second pad 210 that is close to or adjacent to an edge. Therefore, designing the first pad 208 (for example, the first conductive structure 212 and/or the second conductive structure 214) or the second pad 210 to have curved corners may reduce an occurrence of electrostatic discharges (ESD), thereby reduce damages to adjacent elements or increase yield.

In some embodiments shown in FIG. 3, the upper most conductive structure of the first pad 208 (such as the second conductive structure 214) may include a first side E11, a second side E12, a first side E13 and a second side E14, but not limited thereto. In some embodiments, an extension direction of the first side E11 and an extension direction of the first side E13 may be substantially parallel. In some embodiments, an extension direction of the second side E12 and/or an extension direction of the second side E14 may be substantially parallel. In some embodiments, the extension direction of the first side (the first side E11 and/or the first side E13) and the extension direction of the second side (the second side E12 and/or the second side E14) are different from or substantially perpendicular to each other.

In some embodiments shown in FIG. 3, the third curved corner 2360 may be connected to the first side E11 and the second side E12; the third curved corner 2362 may be connected to the first side E13 and the second side E12, the fourth curved corner 2361 may be connected to the first side E11 and the second side E14, the fourth curved corner 2363 may be connected to the first side E13 and the second side E14.

In some embodiments shown in FIG. 3, the first side E11 may have an extension line EL11, the second side E12 may have an extension line EL12, the first side E13 may have an extension line EL13, and the second side E14 may have an extension line EL14. The aforementioned extension lines of the first side or the second side refer to a line extended from a relative straight-line portion of the side. In some embodiments shown in FIG. 3, the extension line EL11 may respectively intersect the extension line EL12 and the extension line EL14, and the extension line EL13 may respectively intersect the extension line EL12 and the extension line EL14. As shown in FIG. 5 (that is, an enlarged area R3 of FIG. 3), the third curved corner 2360 may be defined by a curved edge formed between the first side E11 and the second side E12 that is not overlapped with the extension line EL11 and the extension line EL12. As shown in FIG. 6 (that is, an enlarged area R4 of FIG. 3), the fourth curved corner 2363 may be defined as a curved edge formed between the first side E13 and the second side E14 that is not overlapped with the extension line EL13 and the extension line EL14. Furthermore, the third curved corner 2362 and the fourth curved corner 2361 can be defined in a similar manner as described above; for the sake of clarity, their definitions will not be repeated.

On the other hand, as shown in FIG. 3, the second pad 210 may include a third side E21, a fourth side E22, a third side E23 and a fourth side E24, but not limited thereto.

In some embodiments, an extension direction of the third side E21 and an extension direction of the third side E23 are substantially parallel. In some embodiments, an extension direction of the fourth side E22 and/or an extension direction of the fourth side E24 are substantially parallel. In some embodiments, the extension direction of the third side (the third side E21 and/or the third side E23) and the extension direction of the fourth side (the fourth side E22 and/or the fourth side E24) are different from or substantially perpendicular to each other. In some embodiments, the extension direction of the first side (the first side E11 and/or the first side E13) and the extension direction of the third side (the third side E21 and/or the third side E23) are substantially the same. In some embodiments, the extension direction of the second side (the second side E12 and/or the second side E14) and the extension direction of the fourth side (the fourth side E22 and/or the fourth side E24) are substantially the same.

In some embodiments, the first curved corner 2420 may be connected to the third side E21 and the fourth side E22; the first curved corner 2422 may be connected to the third side E23 and the fourth side E22; the second curved corner 2421 may be connected to the third side E21 and the fourth side E24, the second curved corner 2423 may be connected to the third side E23 and the fourth side E24.

In some embodiments shown in FIG. 3, the third side E21 may have an extension line EL21, the fourth side E22 may have an extension line EL22, the third side E23 may have an extension line EL23, and the fourth side E24 may have an extension line EL24. The aforementioned extension lines of the third side or the fourth side refer to a line extended from a relative straight-line portion of the side.

In some embodiments, the extension line EL21 may respectively intersect with the extension line EL22 and the extension line EL24; the extension line EL23 may respectively intersect with the extension line EL22 and the extension line EL24. As shown in FIG. 5, the first curved corner 2420 may be defined as a curved edge formed between the third side E21 and the fourth side E22 that is not overlapped with the extension line EL21 and the extension line EL22. As shown in FIG. 6, the second curved corner 2423 may be defined as a curved edge formed between the third side E23 and the fourth side E24 that is not overlapped with the extension line EL23 and the extension line EL24. Furthermore, the first curved corner 2422 and the second curved corner 2421 of FIG. 3 can be defined in a similar manner as described above; for the sake of clarity, the definitions will not be repeated.

In some embodiments shown in FIG. 3, the first curved corner of second pad 210 and the adjacent third curved corner of the first pad 208 has a first distance therebetween; the second curved corner of the second pad 210 and the adjacent fourth curved corner of the first pad 208 has a second distance therebetween. The first distance (or the second distance) is measured in a manner exemplified below. For example, as shown in FIGS. 3 and 5, the first curved corner 2420 of the second pad 210 is adjacent to the third curved corner 2360 of the first pad 208. The extension line EL11 of the first side E11 and the extension line EL12 of the second side E12 may intersect at an intersection point C1, and the extension line EL21 of the third side E21 and the extension line EL22 of the fourth side E22 may intersect at an intersection point C2. An extension line CEL1 may be taken that passes the intersection point C1 and the intersection point C2, wherein the extension line CEL1 may intersect the first curved corner 2420 and the third curved corner 2360 at two points (point PP1 and point PP2) respectively. A distance between the two points (point PP1 and point PP2) is defined as a first distance D1.

As shown in FIGS. 3 and 6, the second curved corner 2423 of the second pad 210 is adjacent to the fourth curved corner 2363 of the first pad 208. The extension line EL14 of the second side E14 and the extension line EL13 of the first side E13 may intersect at an intersection point C3, and the extension line EL24 of the fourth side E24 and the extension line EL23 of the third side E23 may intersect at an intersection point C4. An extension line CEL2 may be taken that passes the intersection point C3 and the intersection point C4, wherein the extension line CEL2 may intersect the first curved corner 2423 and the third curved corner 2363 at two points (point PP3 and point PP4) respectively. A distance between the two points (point PP3 and point PP4) is defined as a second distance D4.

Similarly, the first curved corner 2422 and the third curved corner 2362 of FIG. 3 has a first distance D2 therebetween; the second curved corner 2421 and the fourth curved corner 2361 has a second distance D3 therebetween. The first distance D2 and the second distance D3 can be defined in a similar manner as the aforementioned first distance; for the sake of clarity, the definitions will not be repeated.

In some embodiments, a direction of a curve of the aforementioned two adjacent curved corners may be the same or different. As shown in FIG. 3, the concave of the first curved corner 2420 and the concave of the adjacent third curved corner 2360 may face a lower left direction.

In some embodiments, the first distance D1 (and/or the first distance D2) between the first curved corner 2420 and the third curved corner 2360 may not be equal to the second distance D4 (and/or the second distance D3) between the second curved corner 2421 and the fourth curved corner 2361. In some embodiments, the first distance D1 (and/or the first distance D2) may be greater than the second distance D4 (and/or the second distance D3). An area of the first pad 208 that is far away from the conductive line 234 may be more likely to accumulate static charges; therefore, designing the first distance (D1 or D2) to be greater than the second distance (D3 or D4) may reduce the interference of static charges between the second pad 210 and the first pad 208.

In some embodiments, the first distance D1 may or may not be equal to the first distance D2. In some embodiments, the second distance D3 may or may not be equal to the second distance D4. In some embodiments, the first distance D1, the first distance D2, the second distance D3 and/or the second distance D4 may not be equal to one another.

In some embodiments, the first distance D1, the first distance D2, the second distance D3 and/or the second distance D4 may be greater than 0 μm and less than or equal to 10 μm, but not limited thereto. In some embodiments, the first distance D1, the first distance D2, the second distance D3 and/or the second distance D4 may be greater than 0 μm and less than or equal to 8 μm.

Figure 4:
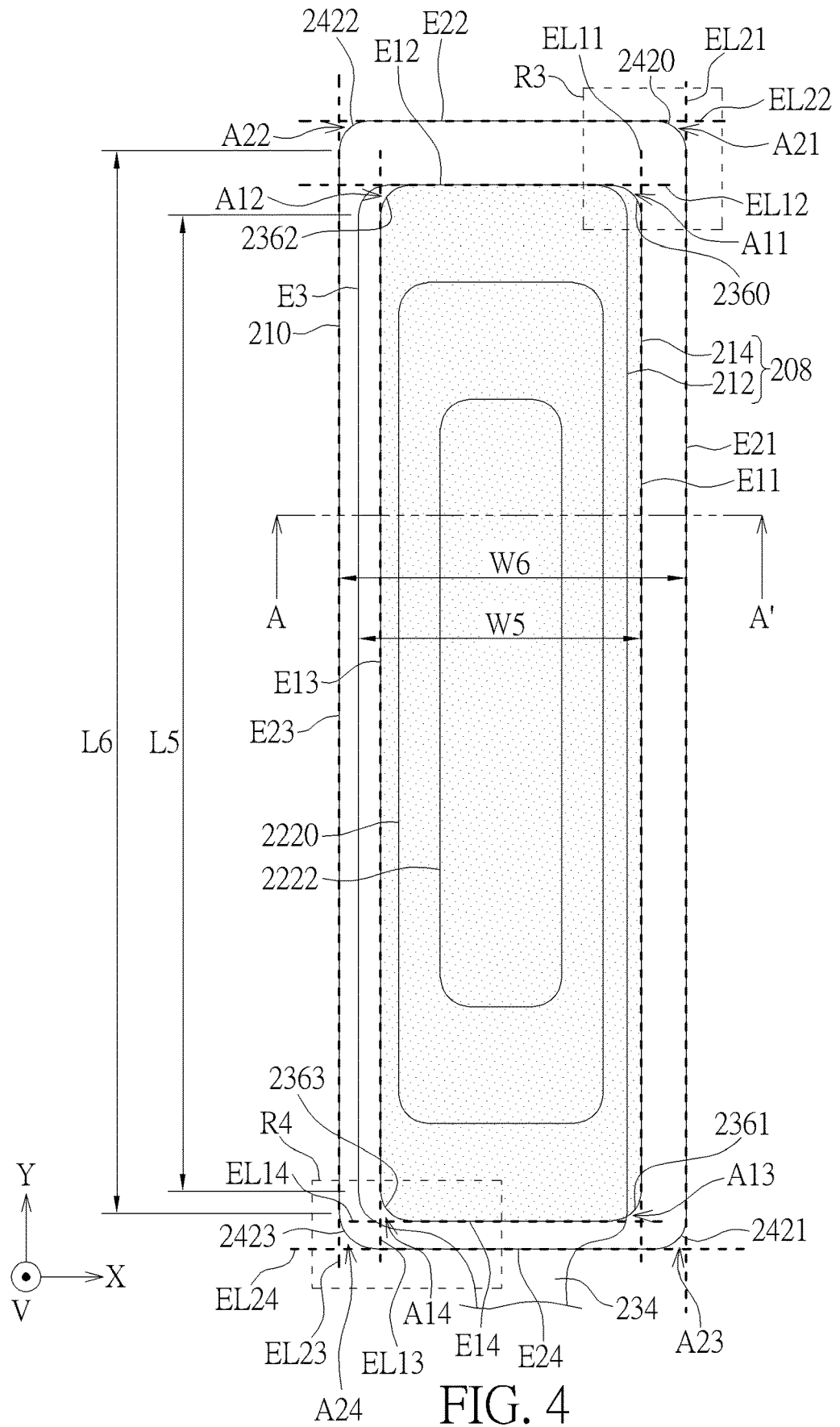
FIG. 4 is another partial top view of the electronic device according to the first embodiment of the present disclosure.

Please refer to FIG. 4, which is another partial top view of the electronic device according to the first embodiment of the present disclosure. The electronic device of FIG. 4 is essentially identical to the embodiment shown in FIG. 3; FIG. 4 is used to more clearly illustrate additional features of the embodiment. Therefore, repeated features and elements will not be described. As shown in FIG. 4, a region defined by the extension line EL11 of the first side E11, the extension line EL12 of the second side E12 and the third curved corner 2360 of the first pad 208 (such as the second conductive structure 214) has a first area A11 (as shown in FIG. 5); a region defined by the extension line EL12 of the second side E12, the extension line EL13 of the first side E13 and the third curved corner 2362 has a first area A12 (enlarged schematic not shown); a region defined by the extension line EL11 of the first side E11, the extension line EL14 of the second side E14 and the fourth curved corner 2361 has a third area A13 (enlarged schematic not shown); a region defined by the extension line EL13 of the first side E13, the extension line EL14 of the second side E14 and the fourth curved corner 2363 has a third area A14 (as shown in FIG. 6).

In some embodiments, the first area (the first area A11 and/or the first area A12) may be equal to the third area (the third area A13 and/or the third area A14), or the first area (the first area A11 and/or the first area A12) may not be equal to the third area (the third area A13 and/or the third area A14).

On the other hand, in the second pad 210 of FIG. 4, the second pad 210 comprises a third side E21 and a fourth side E22, the first curved corner 2420 is connected to the third side E21 and the fourth side E22, a region defined by the extension line EL21 of the third side E21, the extension line EL22 of the fourth side E22 and the first curved corner 2420 has a second area A21 (as shown in FIG. 5); a region defined by the extension line EL22 of the fourth side E22, the extension line EL23 of the third side E23 and the first curved corner 2422 has a second area A22 (enlarged schematic not shown); a region defined by the extension line EL21 of the third side E21, the extension line EL24 of the fourth side E24 and the second curved corner 2421 has a fourth area A23 (enlarged schematic not shown); a region defined by the extension line EL23 of the third side E23, the extension line EL24 of the fourth side E24 and the second curved corner 2423 has a fourth area A24 (as shown in FIG. 6). In some embodiments, the second area (the second area A21 and/or the second area A22) may be equal to the fourth area (the fourth area A23 and/or the fourth area A24), or the second area (the second area A21 and/or the second area A22) may not be equal to the fourth area (the fourth area A23 and/or the fourth area A24).

In some embodiments, the first area A11 may not be equal to the second area A21. In some embodiments, the first area A12 may not be equal to the second area A22. In some embodiments, the third area A13 may not be equal to the fourth area A23. In some embodiments, the third area A14 may not be equal to the fourth area A24. In some embodiments, the first area A11 may be greater than the second area A21. In some embodiments, the first area A12 may be greater than the second area A22. In some embodiments, the third area A13 may be greater than the fourth area A23. In some embodiments, the third area A14 may be greater than the fourth area A24.

As described above, designing the first area to be greater than the second area, or designing the third area to be greater than the fourth area can be equivalent to designing a curvature of the curved corner of the first pad 208 to be greater than a curvature of the curved corner of the second pad 210. In this manner, static charge accumulation on the first pad 208 during production or manufacturing processes may be reduced; damages to adjacent elements (such as the second pad 210, the integrated circuit chip or other electronic elements/components) caused by static discharge may be mitigated.

In some embodiments, an arc length of the third curved corner may be greater than an arc length of the first curved corner, or an arc length of the fourth curved corner may be greater than an arc length of the second curved corner. For example, in some embodiments, an arc length of a projection of the third curved corner of the upper most conductive structure of the first pad 208 (such as the second conductive structure 214) onto the substrate 100 may be greater than an arc length of a projection of the first curved corner of the second pad 210 onto the substrate 100. In some embodiments, an arc length of a projection of the fourth curved corner of the upper most conductive structure of the first pad 208 (such as the second conductive structure 214) onto the substrate 100 may be greater than an arc length of a projection of the second curved corner of the second pad 210 onto the substrate 100.

In some embodiments shown in FIG. 3, the first pad 208 includes the first conductive structure 212 and the second conductive structure 214, a length of a side or a width of the first pad (and the second pad) may be illustrated by FIG. 3. As shown in FIG. 3, a length of a side of the first pad 208 may be a length of the first side E11 (or the first side E13) in a Y direction, wherein the Y direction may be defined by a direction perpendicular to an extension direction of the integrated circuit chip. As shown in FIG. 3, a length of a side of the second pad 210 may be a length of the third side E21 (or the third side E23) in the Y direction. An extension direction of the integrated circuit chip 112 or the integrated circuit chip 114 shown in FIG. 1 may be substantially parallel to an X direction, and the Y direction is perpendicular to the normal direction V of the substrate 100. In other words, the length of the side of the first pad 208 is measured as the length of one of the sides of the first pad 208 that is substantially parallel to the Y direction (such as the first side E11 or the third side E13), and the side is connected to the aforementioned curved corner (the third curved corner and/or the fourth curved corner). The length of the side of the second pad 210 is measured as the length of one of the sides of the second pad 210 that is substantially parallel to the Y direction (such as the third side E21 or the third side E23), and the side is connected to the aforementioned curved corner (the first curved corner and/or the second curved corner). It is worth noting that, the comparison between the length of the side of the first pad 208 and the length of the side of the second pad 210 needs to be performed on the same direction (such as the Y direction). As shown in FIG. 3, the first pad 208 has a length of L5; the second pad 210 has a length of L6.

It is worth noting that, the first pad 208 (or the first pad 210) has a plurality of conductive structures, the length of the side of the first pad 208 (or the first pad 210) is a length of an edge of the outline of the entire first pad 208 (or the first pad 210) projected onto the substrate 100 in the Y direction.

Additionally, as shown in FIG. 3, the width of the first pad 208 may be defined by the largest width of the first pad 208 in the X direction, and the width of the second pad 210 may be defined by the largest width of the second pad 210 in the X direction. In some embodiments, the X direction may be substantially perpendicular to the Y direction and the normal direction V of the substrate 100. For example, as shown in FIG. 3, the first pad 208 has a width W5; the second pad 210 has a width W6. It should be noted that, when the first pad 208 (or the first pad 210) has a plurality of conductive structures, the width of the first pad 208 (or the first pad 210) is a largest width of an outline of the entire first pad 208 (or the first pad 210) projected onto the substrate 100 in the X direction.

Subsequent paragraphs will continue to detail other embodiments of the present disclosure. For simplicity, identical elements will be denoted by the same reference signs. To illustrate the differences between various embodiments, the following paragraphs will describe in more detail the differences between various embodiments while omitting descriptions regarding previously discussed features.

Figure 7:
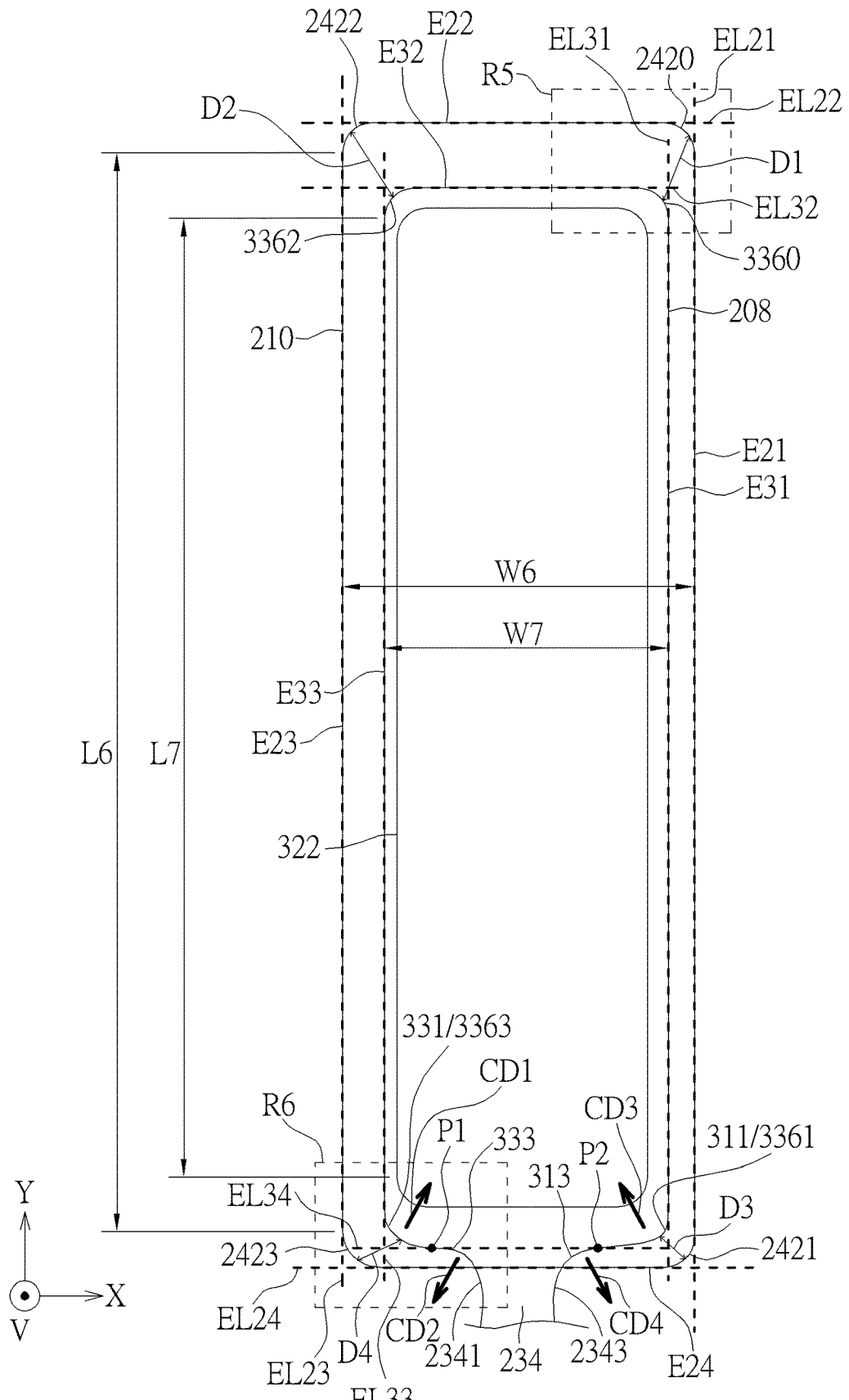
FIG. 7 is a partial top view of the electronic device according to a second embodiment of the present disclosure.
Figure 9:
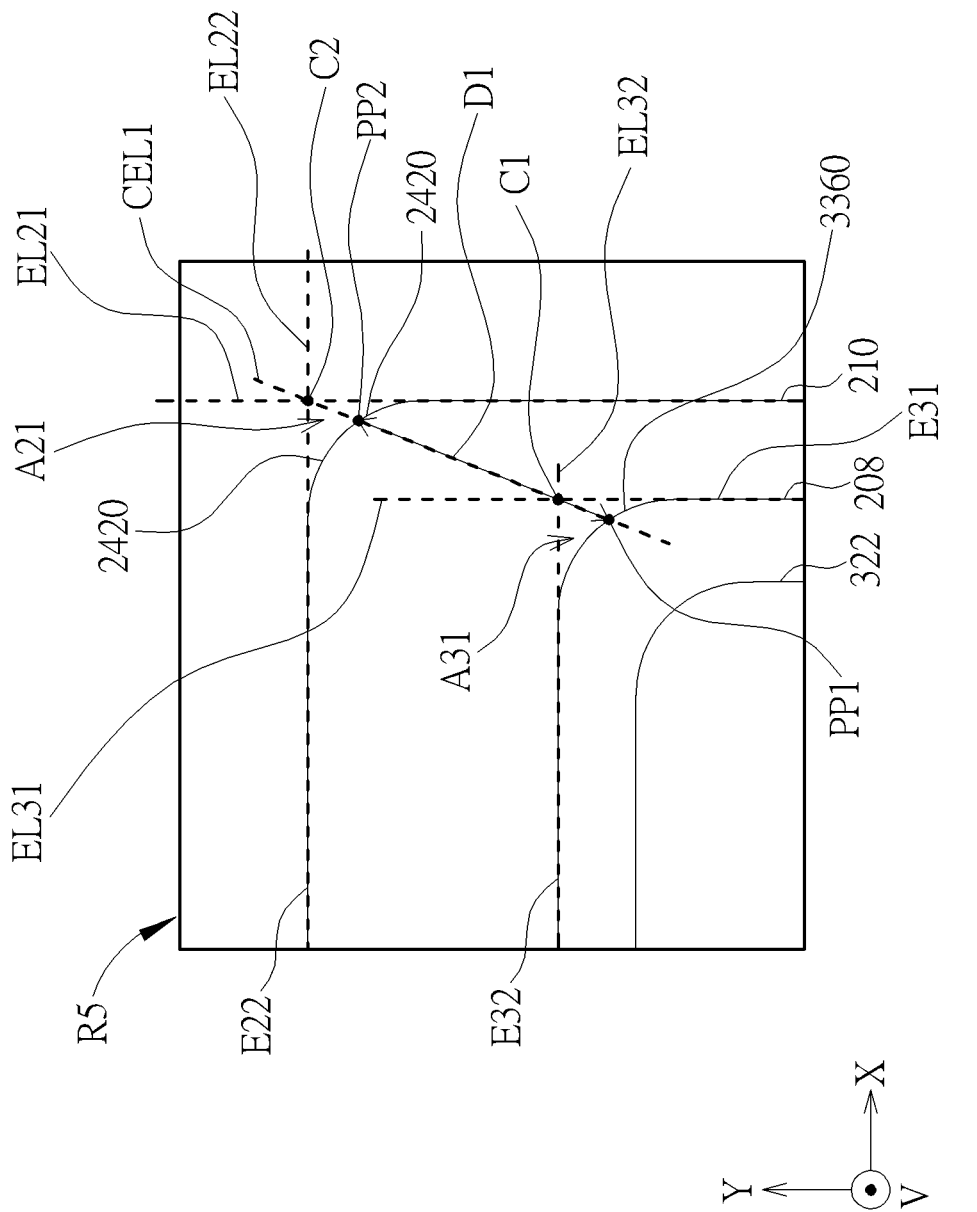
FIG. 9 is an enlarged schematic diagram of an area R5 of FIG. 7.
Figure 10:
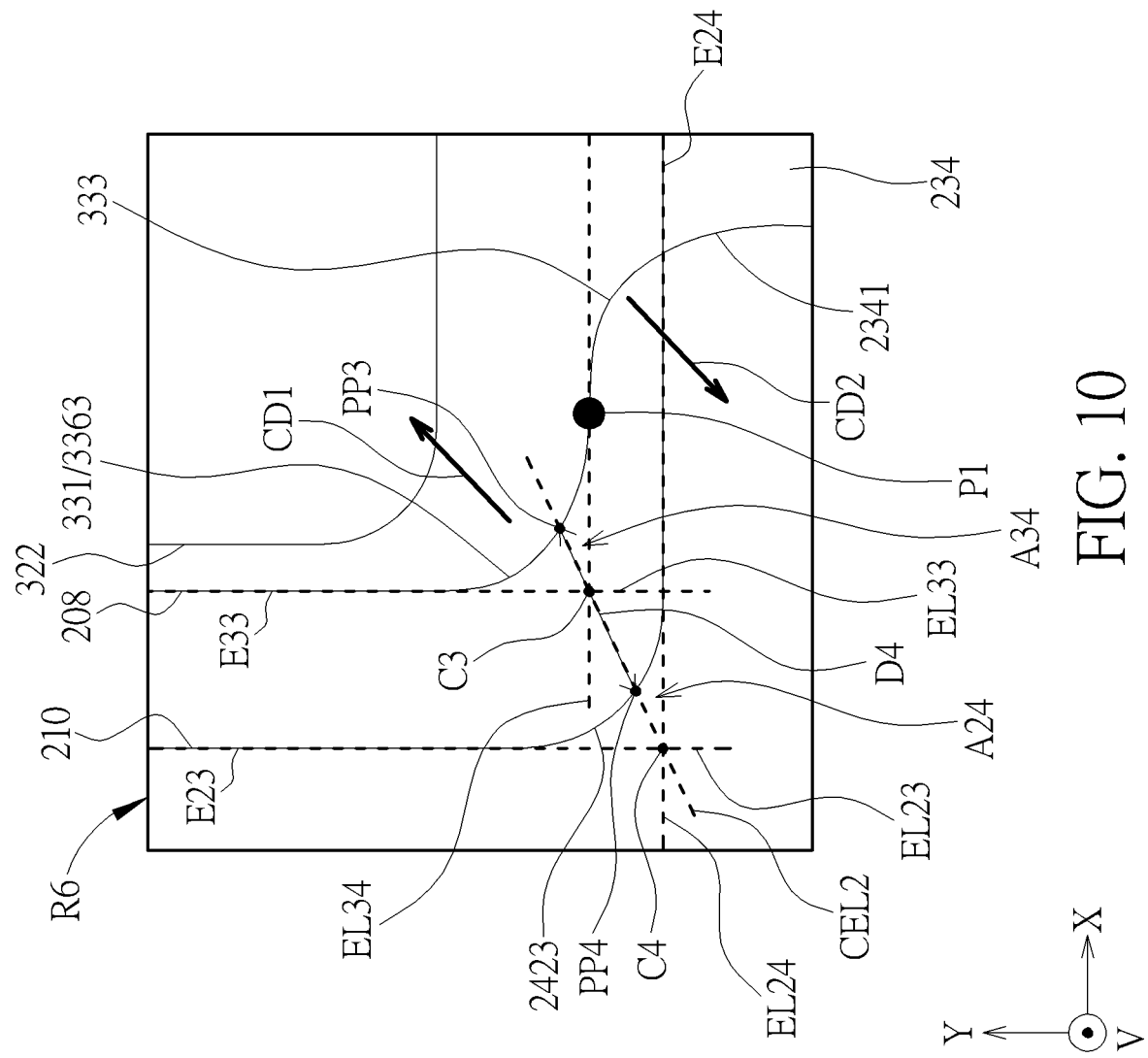
FIG. 10 is an enlarged schematic diagram of an area R6 of FIG. 7.

Please refer to FIGS. 7, 9 and 10. FIG. 7 is a partial top view of the electronic device according to a second embodiment of the present disclosure. FIG. 9 is an enlarged schematic diagram of an area R5 of FIG. 7. FIG. 10 is an enlarged schematic diagram of an area R6 of FIG. 7. Unlike the first embodiment shown in FIG. 3, the first pad 208 of some embodiments shown in FIG. 7 may include a layer of conductive structure. The conductive structure may include a single sub-layer or multiple sub-layers stacked above each other, but not limited thereto. The first pad 208 and the conductive line 234 may include the same conductive structure, and the first pad 208 may be connected to the conductive line 234, but not limited thereto. Furthermore, an opening 322 may expose a portion of the first pad 208; that is, the opening 322 may overlap with a portion of the first pad 208 in the normal direction V of the substrate 100, but not limited thereto. The second pad 210 may contact the first pad 208 through the opening 322, or the second pad 210 may be electrically connected to the first pad 208 through the opening 322.

As shown in FIG. 7, the first pad 208 may include a first side E31, a second side E32 and a first side E33. The first side E31 may have an extension line EL31, the second side E32 may have an extension line EL32, and the first side E33 may have an extension line EL33. In some embodiments, the first side E31 and the first side E33 may be substantially parallel, but not limited thereto. These extension lines EL31-EL33 are defined in a similar manner as those in the first embodiment.

Furthermore, the first pad 208 and the conductive line 234 may have two connection points (connection point P1 and connection point P2) therebetween. More specifically, as shown in FIGS. 7 and 10, the conductive line 234 is connected to the first pad 208, and the conductive line 234 has a first side 2341 and a second side 2343. The first side 2341 has a curved edge 333, and the second side 2343 has a curved edge 313. Additionally, the first pad 208 has a curved edge 331 and a curved edge 311; the curved edge 331 is connected to the first side E33 of the first pad 208 and the curved edge 333 of the conductive line 234. A curve direction CD1 of the curved edge 331 of the first pad 208 is different from a curve direction CD2 of the curved edge 333 of the first side 2341 of the conductive line 234. In some embodiments, the curve direction CD1 of the curved edge 331 of the first pad 208 may be substantially opposite to the curve direction CD2 of the curved edge 333 of the first side 2341 of the conductive line 234, but not limited thereto. The curved edge 331 and the curved edge 333 may be connected to the connection point P1.

Similarly, as shown in FIGS. 7 and 10, the curved edge 311 is connected to the first side E31 of the first pad 208 and the curved edge 313 of the conductive line 234. A curve direction CD3 of the curved edge 311 of the first pad 208 is different from a curve direction CD4 of the curved edge 313 of the second side 2343 of the conductive line 234. In some embodiments, the curve direction CD3 of the curved edge 311 may be substantially opposite to the curve direction CD4 of the curved edge 313, but not limited thereto. The curved edge 311 and the curved edge 313 may be connected to the connection point P2.

Furthermore, as shown in FIGS. 7 and 10, an extension line EL34 may be parallel to the extension line EL32 and pass through the connection point P1, or the extension line EL34 may be parallel to the extension line EL32 and pass through the connection point P2, but not limited thereto. In some embodiments, the connection point P1 and the connection point P2 may not be present on the same horizontal line along the Y direction; that is, a line connecting the connection point P1 and the connection point P2 may not be parallel to the extension line EL32. In this manner, the extension line passing through the connection point P1 may be different from the extension line passing through the connection point P2, but not limited thereto.

In some embodiments, the curved edge 331 may substantially be one of the curved corners (such as a fourth curved corner 3363) of the first pad 208, and the curved edge 311 may substantially be another one of the curved corners (such as a fourth curved corner 3361) of the first pad 208.

As shown in FIG. 9 (an enlarged schematic diagram of an area R5 of FIG. 7), a third curved corner 3360 may be defined by a curved edge formed between the first side E31 and the second side E32 that is not overlapped with the extension line EL31 and the extension line EL32, wherein the third curved corner 3360 may connect the first side E31 and the second side E32. As shown in FIG. 10 (an enlarged schematic diagram of an area R6 of FIG. 7), a fourth curved corner 3363 may be defined by a curved edge 331 formed between the first side E33 and the connection point P1 that is not overlapped with the extension line EL33 and the extension line EL34. Furthermore, the third curved corner 3362 and the fourth curved corner 3361 of FIG. 7 are defined in a similar manner as described in the first embodiment; for the sake of clarity, the definitions will not be repeated.

Please refer to FIG. 7, a distance between the first curved corner 2420 and the third curved corner 3360 is defined as a first distance D1, a distance between the first curved corner 2422 and the third curved corner 3362 is defined as the first distance D2, a distance between the second curved corner 2421 and the fourth curved corner 3361 is defined as a second distance D3, and a distance between the second curved corner 2423 and the fourth curved corner 3363 is defined as a second distance D4. The first distance D1, the first distance D2, the second distance D3 and the second distance D4 of the present embodiment may have identical or similar features as those of the first embodiment, such as the first distance being greater than the second distance; descriptions of such similar features will be omitted for clarity.

Figure 8:
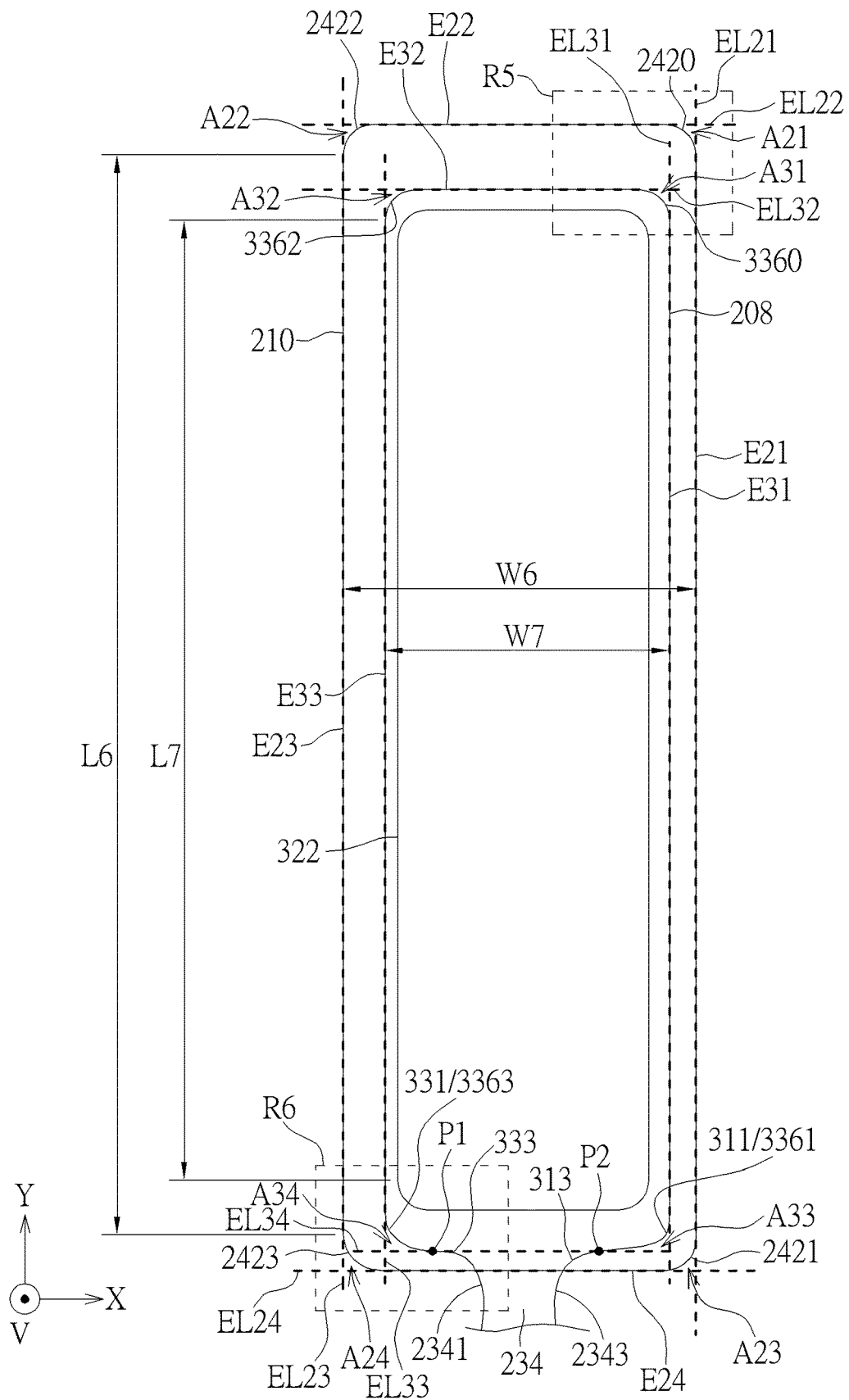
FIG. 8 is another partial top view of the electronic device according to the second embodiment of the present disclosure.

Please refer to FIG. 8, which is another partial top view of the electronic device according to the second embodiment of the present disclosure. The electronic device of FIG. 8 is essentially identical to the embodiment shown in FIG. 7; FIG. 8 is used to more clearly illustrate additional features of the embodiment. Therefore, repeated features and elements will not be described. Within the first pad 208, a region defined by the extension line EL31 of the first side E31, the extension line EL32 of the second side E32 and the third curved corner 3360 has a first area A31 (as shown in FIG. 9); a region defined by the extension line EL32 of the second side E32, the extension line EL33 of the first side E33 and the third curved corner 3362 has a first area A32 (enlarged schematic not shown); a region defined by the extension line EL31 of the first side E31, the extension line EL34 and the fourth curved corner 3361 has a third area A33 (enlarged schematic not shown); a region defined by the extension line EL33 of the first side E33, the extension line EL34 and the fourth curved corner 3363 has a third area A34 (as shown in FIG. 10). In some embodiments, the first area (the first area A31 and/or the first area A32) may be the same or different from the third area (the third area A33 and/or the third area A34).

In some embodiments, the first area A31 may not be equal to the second area A21. In some embodiments, the first area A32 may not be equal to the second area A22. In some embodiments, the third area A33 may not be equal to the fourth area A23. In some embodiments, the third area A34 may not be equal to the fourth area A24. In some embodiments, the first area A31 may be greater than the second area A21. In some embodiments, the first area A32 may be greater than the second area A22. In some embodiments, the third area A33 may be greater than the fourth area A23. In some embodiments, the third area A34 may be greater than the fourth area A24.

In some embodiments shown in FIG. 7, when the first pad 208 includes a layer of conductive structure, the length of a side of the first pad (and the second pad) or the width of the first pad (and the second pad) of FIG. 1 may be illustrated using FIG. 7.

A length of a side of the first pad 208 may be a length of the first side E31 (or the first side E33) in the Y direction. As shown in FIG. 7, and as mentioned above, the length of a side of the second pad 210 may be a length of the third side E21 (or the third side E23) in the Y direction. In other words, the length of the side of the first pad 208 is measured as the length of one of the sides of the first pad 208 that is substantially parallel to the Y direction (such as the first side E31 or the third side E33), and the side is connected to the aforementioned curved corner (the third curved corner and/or the fourth curved corner). The length of the side of the second pad 210 is measured as the length of one of the sides of the second pad 210 that is substantially parallel to the Y direction (such as the third side E21 or the third side E23), and the side is connected to the aforementioned curved corner (the first curved corner and/or the second curved corner). As shown in FIG. 7, the first pad 208 has a length L7 and the second pad 210 has a length L6.

As shown in FIG. 7, the width of the first pad 208 may be defined by the largest width of the first pad 208 in the X direction, and the width of the second pad 210 may be defined by the largest width of the second pad 210 in the X direction. As shown in FIG. 7, the first pad 208 has a width W7, and the second pad 210 has a width W6.

Figure 11:
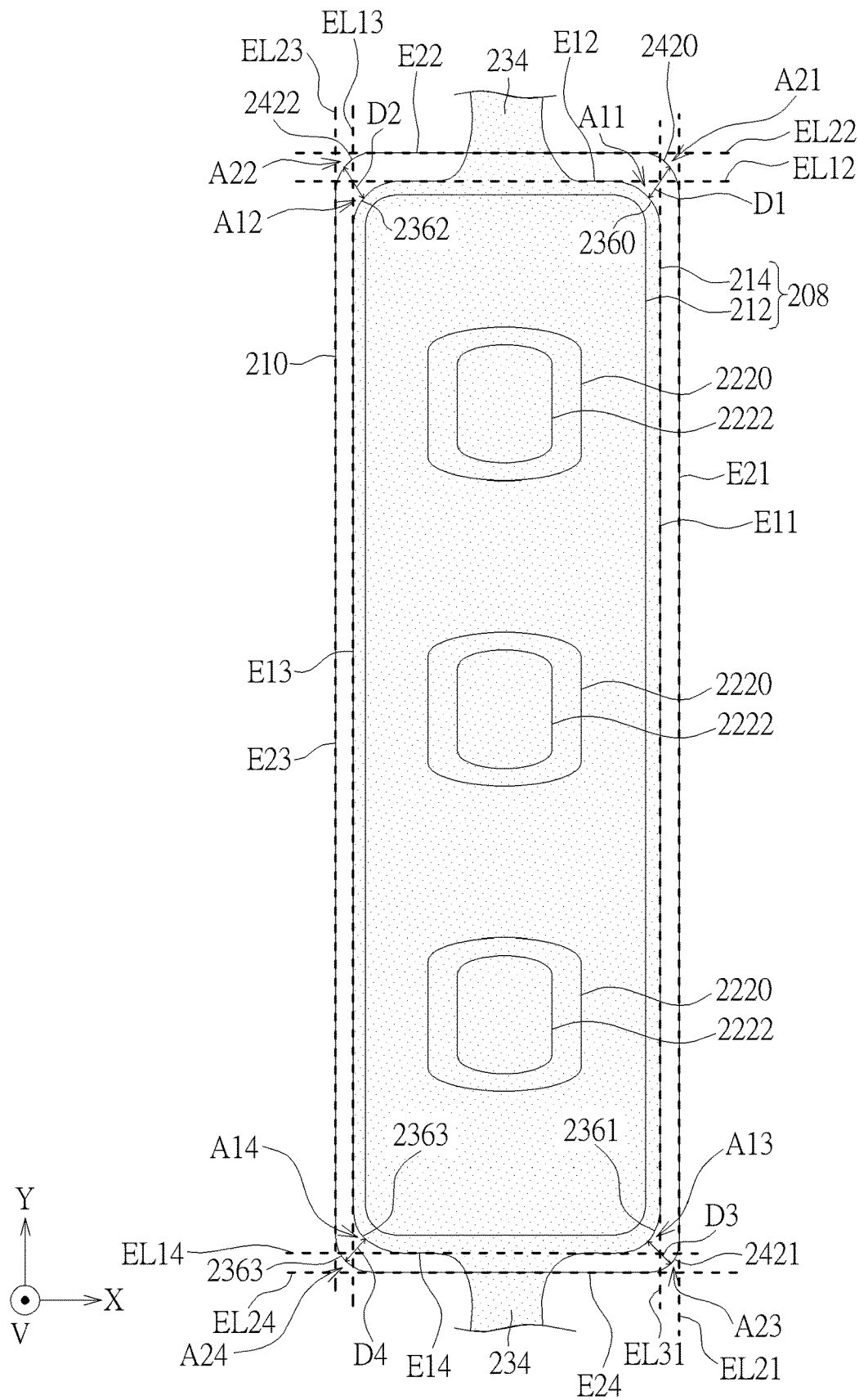
FIG. 11 is a partial top view of the electronic device according to a third embodiment of the present disclosure.

Please refer to FIG. 11, which is a partial top view of the electronic device according to a third embodiment of the present disclosure. Unlike the first embodiment (shown in FIG. 3), the first insulating layer 218 (as shown in FIG. 2) of some embodiments (such as those shown in FIG. 11) may include at least one opening (such as three openings 2220) that is used to expose a portion of the first conductive structure 212, and the second insulating layer 220 (as shown in FIG. 2) may include at least one opening (such as three openings 2222) that is used to expose a portion of the second conductive structure 214. In some embodiments shown in FIG. 11, the second pad 208 is electrically connected to the first pad 208 through the opening 2220 and/or the opening 2222.

Please refer to FIG. 11, in some embodiments, an end of the first pad 208 may be connected to the conductive line 234 (such as the conductive line adjacent to the operating region R1), and another end of the first pad 208 may be connected to another conductive line 234 (such as the conductive line away from the operating region R1). As an example, the conductive line 234 (the conductive line adjacent to the operating region R1) may include a data line, a read line or a scan line. The conductive line 234 (the conductive line away from the operating region R1) may connect to testing circuits (not shown) or other elements and devices disposed in the peripheral region R2, but not limited thereto.

In some embodiments, an area of the second conductive structure 214 of the first pad 208 may be greater than an area of the first conductive structure 212 of the first pad 208, but not limited thereto. Remaining features of the present embodiment may be identical to those of the first embodiment and will not be described.

As shown in the aforementioned first embodiment to the third embodiment, the shape of the first pad and/or the shape of the second pad may for example be a rectangle with curved corners, but not limited thereto. In some embodiments (not shown), the shape of the first pad and/or the shape of the second pad may be a circle, an ellipse or any other shapes with curved or arc edges, but not limited thereto.

In summary, the first pad or the second pad of the electronic device of the present disclosure has a plurality of curved corners that may reduce damages to the first pad or the second pad caused by electrostatic discharges. By designing a distance between the first curved corner and the third curved corner (that is, the first distance) to be greater than a distance between the second curved corner and the fourth curved corner (that is, the second distance), effects of static charges between the second pad and the first pad may be mitigated.

Even though embodiments and advantages of the present disclosure have been described as above, it should be understood that those skilled in the art may modify, substitute or amend features of the present disclosure without departing from the essence and scope of the present disclosure. Furthermore, the scope of the present disclosure is not limited to a manufacturing or production process, equipment, composition, method or methodology described therein; those skilled in the art may realize current or future manufacturing or production process, equipment, composition, method or methodology using the same that have been disclosed in the present disclosure and embodiments. Substantially the same functions being implemented or substantially the same results being obtained in the embodiments described herein may be used according to the present disclosure. Therefore, the scope of the present disclosure includes but is not limited to the aforementioned manufacturing or production process, equipment, composition, method or methodology. Furthermore, every claim of the present disclosure encompasses an individual embodiment, and the scope of the present disclosure also includes every claim, embodiments and a combination thereof.

What is claimed is:

1. An electronic device, comprising:
    a substrate;
    a conductive pad disposed on the substrate, wherein the conductive pad comprises a first pad and a second pad disposed on the first pad;
    an insulating layer disposed between the first pad and the second pad, wherein the insulating layer comprises an opening, and the second pad is electrically connected to the first pad through the opening, wherein an outline of the opening comprises a plurality of curved corners in a normal direction of the substrate;
    a chip disposed on the conductive pad; and
    an anisotropic conductive film disposed between the chip and the second pad, wherein the chip is electrically connected to the second pad through the anisotropic conductive film.

2. The electronic device according to claim 1, the first pad comprising:
    a first conductive structure; and
    a second conductive structure disposed on and electrically connected to the first conductive structure.

3. The electronic device according to claim 2, further comprising:
    another insulating layer disposed between the first conductive structure and the second conductive structure, wherein the another insulating layer comprises another opening, wherein the second conductive structure is electrically connected to the first conductive structure through the another opening.

4. The electronic device according to claim 3, wherein an outline of the another opening comprises a plurality of curved corners in the normal direction of the substrate.

5. The electronic device according to claim 3, wherein a projected area of the another opening onto the substrate is greater than a projected area of the opening onto the substrate.

6. The electronic device according to claim 1, further comprising a conductive line connected to the conductive pad, wherein the conductive line comprises a first side and a second side opposite to the first side, the first side comprises a curved edge, and the second side comprises a curved edge.

7. The electronic device according to claim 1, wherein the chip comprises a bump electrically connected to the conductive pad, and a width of the bump is less than or equal to a width of the conductive pad.

8. The electronic device according to claim 1, wherein the second pad has a recess overlapping the opening of the insulating layer.

\* \* \* \* \*